(12) United States Patent
Yoshida et al.

(10) Patent No.: US 7,951,679 B2
(45) Date of Patent: May 31, 2011

(54) METHOD FOR FABRICATING SEMICONDUCTOR DEVICE

(75) Inventors: Koji Yoshida, Kyoto (JP); Keita Takahashi, Nara (JP); Fumihiko Noro, Toyama (JP); Masatoshi Arai, Nara (JP); Nobuyoshi Takahashi, Nara (JP)

(73) Assignee: Panasonic Corporation, Osaka (JP)

( * ) Notice: Subject to any disclaimer, the term of this patent is extended or adjusted under 35 U.S.C. 154(b) by 564 days.

(21) Appl. No.: 11/187,958

(22) Filed: Jul. 25, 2005

(65) Prior Publication Data

US 2006/0035418 A1    Feb. 16, 2006

(30) Foreign Application Priority Data

Aug. 16, 2004    (JP) .................................. 2004-236714

(51) Int. Cl.
H01L 21/336    (2006.01)
(52) U.S. Cl. ........ 438/298; 438/418; 438/419; 438/431; 438/432; 438/439; 438/443; 438/444; 438/447; 438/449; 438/452
(58) Field of Classification Search .................. 438/415, 438/418, 419, 420, 425, 426, 431, 432, 439, 438/443, 444, 447, 449, 452, 298
See application file for complete search history.

(56) References Cited

U.S. PATENT DOCUMENTS

| | | | |
|---|---|---|---|
| 6,514,831 B1 * | 2/2003 | Liu | 438/303 |
| 6,773,999 B2 | 8/2004 | Yoneda | |
| 2003/0222294 A1 * | 12/2003 | Yoshino | 257/298 |
| 2004/0070018 A1 * | 4/2004 | Keeth et al. | 257/300 |
| 2004/0256677 A1 * | 12/2004 | Kanda et al. | 257/369 |
| 2005/0202672 A1 * | 9/2005 | Divakaruni et al. | 438/652 |

FOREIGN PATENT DOCUMENTS

| | | |
|---|---|---|
| CN | 1398005 A | 2/2003 |
| JP | 63-221673 | 9/1988 |
| JP | 64-025483 | 1/1989 |
| JP | 01-125976 | 5/1989 |

(Continued)

OTHER PUBLICATIONS

Chinese Office Action mailed Apr. 3, 2009, with English Translation.

(Continued)

*Primary Examiner* — N Drew Richards
*Assistant Examiner* — Jae Lee
(74) *Attorney, Agent, or Firm* — McDermott Will & Emery LLP

(57) ABSTRACT

First, on a semiconductor region of a first conductivity type, a trapping film is formed which stores information by accumulating charges. Then, the trapping film is formed with a plurality of openings, and impurity ions of a second conductivity type are implanted into the semiconductor region from the formed openings, thereby forming a plurality of diffused layers of the second conductivity type in portions of the semiconductor region located below the openings, respectively. An insulating film is formed to cover edges of the trapping film located toward the openings, and then the semiconductor region is subjected to a thermal process in an atmosphere containing oxygen to oxidize upper portions of the diffused layers. Thereby, insulating oxide films are formed in the upper portions of the diffused layers, respectively. Subsequently, a conductive film is formed over the trapping film including the edges thereof to form an electrode.

6 Claims, 10 Drawing Sheets

FOREIGN PATENT DOCUMENTS

| | | |
|---|---|---|
| JP | 09-074146 | 3/1997 |
| JP | 11-144483 | 5/1999 |
| JP | 11-317508 | 11/1999 |
| JP | 2000-049244 | 2/2000 |
| JP | 2001-77220 A | 3/2001 |

OTHER PUBLICATIONS

Japanese Office Action, with English translation, Japanese Patent Application No. 2004-236714, mailed Jun. 23, 2009.

* cited by examiner

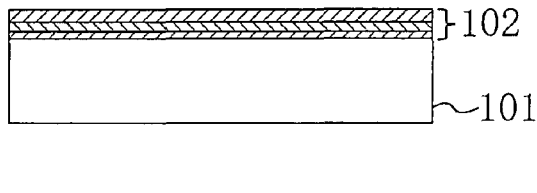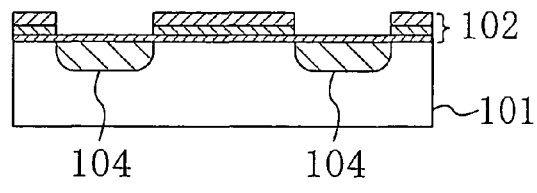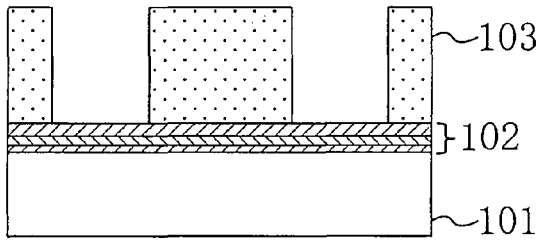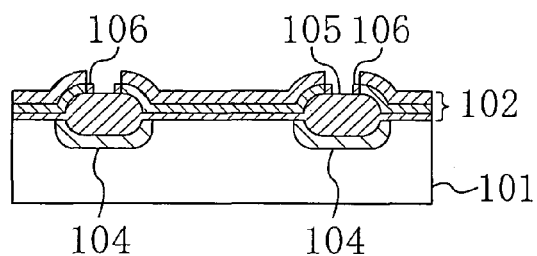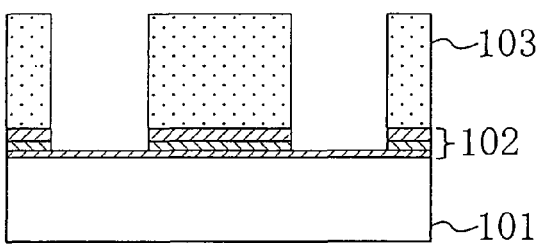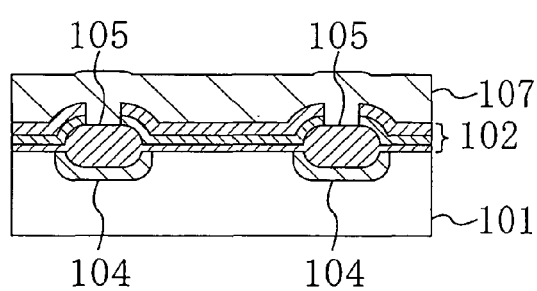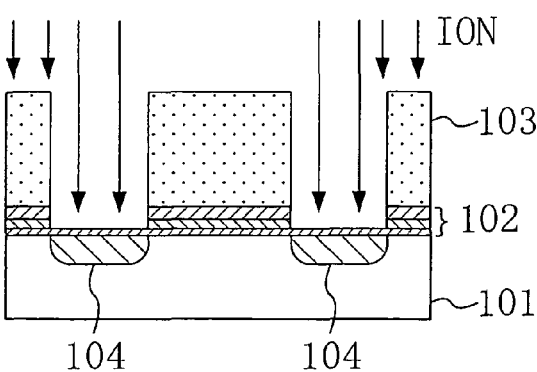

METHOD FOR FABRICATING SEMICONDUCTOR DEVICE

CROSS-REFERENCE TO RELATED APPLICATIONS

This application claims priority under 35 U.S.C. §119 on Patent Application No. 2004-236714 filed in Japan on Aug. 16, 2004, the entire contents of which are hereby incorporated by reference.

BACKGROUND OF THE INVENTION (a) Fields of the Invention

The present invention relates to methods for fabricating a semiconductor device. In particular, the present invention relates to methods for fabricating a semiconductor device which includes a trapping film for charge accumulation and a bit line both provided for a MONOS nonvolatile semiconductor memory device.

(b) Description of Related Art

MONOS (metal-oxide-nitride-oxide-semiconductor) nonvolatile semiconductor memory devices are nonvolatile semiconductor memory devices in which charges are accumulated in an ONO film of a stacked structure made by sequentially stacking silicon oxide, silicon nitride, and silicon oxide. Until now, various types of MONOS nonvolatile semiconductor memory devices have been proposed. Among them, an attention-getting one is a nonvolatile semiconductor memory device which has: a bit line formed in a semiconductor substrate; an ONO film formed on a channel region; and a word line formed above the bit line to perpendicularly intersect the bit line, and which stores information by accumulating charges locally in the ONO film (see, for example, Japanese Unexamined Patent Publication No. 2001-77220). The reason why this device receives attention is that it is suitable for high integration, performance enhancements and voltage reduction.

Hereinafter, with reference to FIGS. 8A to 8G, description will be made of an example of conventional methods for fabricating a nonvolatile semiconductor memory device in which bit lines are formed in a semiconductor substrate.

Referring to FIG. 8A, first, a trapping film 102 of an ONO film is formed on a semiconductor substrate 101 of a first conductivity type.

Next, as shown in FIG. 8B, on the trapping film 102, a photoresist pattern 103 is formed which defines a layout of a plurality of bit lines.

As shown in FIG. 8C, upper portions of the trapping film 102 are removed using the photoresist pattern 103 as a mask. Note that in this removal, lower portions of the trapping film 102 are left, but those portions of the trapping film 102 may be fully removed to expose the semiconductor substrate 101.

Subsequently, as shown in FIG. 8D, using the photoresist pattern 103 as a mask, impurity ions of a second conductivity type are implanted into the semiconductor substrate 101 through the lower portions of the ONO film 102. Thereby, a plurality of diffused layers 104 of the second conductive type are formed in regions of the semiconductor substrate 101 located below openings of the photoresist pattern 103.

Next, as shown in FIG. 8E, the photoresist pattern 103 is removed and then, as shown in FIG. 8F, the diffused layers 104 are subjected to enhanced oxidation. Thereby, an upper portion of each diffused layer 104 and both ends of the trapping film 102 located toward each opening are formed with insulating oxide films 105 and 106 of silicon oxide, respectively. Simultaneously with this, the implanted impurity ions are activated to form bit lines made of the diffused layers 104.

As shown in FIG. 8G, a polysilicon 107 having conductivity is deposited on the ONO film 102 and the insulating oxide films 105 to form an electrode (a word line) made of the conductive polysilicon 107. In the manner described above, a nonvolatile semiconductor memory device is completed.

SUMMARY OF THE INVENTION

The inventors made various studies and then found that the above-described conventional method for fabricating a nonvolatile semiconductor memory device causes a problem of failing to obtain desired device characteristics due to damages to the ends of the trapping film 102 located toward the insulating oxide film 105. Moreover, the inventors found out that the damages to the ends of the trapping film 102 are caused by two factors as mentioned below.

The first factor is that in the thermal oxidation process for performing enhanced oxidation to form the insulating oxide films 105 on top of the diffused layers 104 serving as the bit lines, the silicon oxide films 106 with a thickness of about 3 nm are simultaneously formed on the end surfaces of the silicon nitride film which is an intermediate layer of the trapping film 102 and that, however, the silicon oxide films 106 formed on the end surfaces of the silicon nitride film are removed mainly in a cleaning process subsequent to the oxidation process. Thus, the silicon nitride film is partly exposed which is the intermediate layer of the trapping film 102, so that the word line 107 comes into direct contact with edges of the silicon nitride film exposed at the ends of the trapping film 102. This degrades the data retention capability of the device.

To be more specific, as shown in FIG. 9A, when a positive potential bias is applied to the word line 107 in a reading operation, electrons trapped in the silicon nitride film 102b move laterally (in the direction parallel with the substrate surface) to go out into the word line 107. This fluctuates the threshold voltage of a memory cell as shown in FIG. 9B, which causes a problem of a change of a program state in the cell.

The second factor is that the photoresist pattern 103 is shrunk in the dry etching process of the trapping film 102 and the impurity implantation process, whereby at the both ends of the trapping film 102, a silicon oxide film which is an upper oxide layer of the trapping film 102 is damaged by ion implantation. Because of the implantation damage, in the removal process of the photoresist pattern 103 and the cleaning process before the enhanced oxidation process, the both ends of the upper oxide layer of the trapping film 102 are locally reduced in thickness, and thus the upper surface of the silicon nitride film which is the intermediate layer is exposed at the both ends. Therefore, the area of the exposed silicon nitride film in direct contact with the word line increases, so that the data retention capability of the device is degraded as mentioned above.

The second factor will be concretely described using FIGS. 10A to 10C. As shown in FIG. 10A, shrinkage of the photoresist pattern 103 causes local penetration of implanted ions through the both ends of the upper oxide layer of the trapping film 102, so that the ion-penetrated portions of the upper oxide layer of the trapping film 102 are damaged. That is to say, the ion implantation cuts bonding of atoms forming the upper oxide layer of the trapping film 102, and thus the damaged portions have a higher etch rate than undamaged portions thereof where ions do not penetrate. Therefore, as shown in FIG. 10B, the both ends of the trapping film 102 are locally reduced in thickness. In this state, when enhanced oxidation is performed on the diffused layers 104 to form the insulating oxide films 105 and then the word line 107 also serving as an electrode is formed, the state shown in an enlarged view of FIG. 10C is obtained.

As shown in FIG. 10C, the thickness-reduced portion of the trapping film 102 is located in proximity to a charge accumulation portion. Moreover, since the upper surface of the end of the silicon nitride film 102b is exposed, the area of the silicon nitride film 102b in direct contact with the word line 107 increases to degrade the data retention capability and also to lower the electrical breakdown voltage of the trapping film 102. If a larger mass number of impurity ions are implanted at a higher dose, implantation damage to the trapping film 102 is severer. Therefore, the wet etching rate thereof further increases, and thereby the upper oxide layer of the trapping film 102 is reduced in thickness more significantly. In particular, in the case where a KrF excimer laser is used as an exposure light, a KrF photoresist for this laser used for a mask pattern has low heat resistance. Thus, the photoresist pattern of the KrF photoresist is more significantly shrunk in an ion implantation.

An object of the present invention is to solve the conventional problems mentioned above and to provide a highly reliable semiconductor device capable of preventing degradation in the data retention capability of a memory cell with a trapping film.

To accomplish the above object, in the present invention, a method for fabricating a semiconductor device is designed so that at least edges of a trapping film are covered with insulating films, respectively, to prevent an electrode from coming into direct contact with a silicon nitride film serving as a substantial charge accumulation layer of the trapping film.

To be more specific, a first method for fabricating a semiconductor device according to the present invention is characterized by including the step of: (a) forming, on a semiconductor region of a first conductivity type, a trapping film for storing information by accumulating charges; (b) forming a plurality of openings in the trapping film and implanting impurity ions of a second conductivity type into the semiconductor region through the formed openings, thereby forming a plurality of diffused layers of the second conductivity type in portions of the semiconductor region located below the openings, respectively; (c) forming an insulating film to cover edges of the trapping film located toward the openings; (d) subjecting, after the step (c), the semiconductor region to a thermal process in an atmosphere containing oxygen to oxidize upper portions of the diffused layers, thereby forming insulating oxide films in the upper portions of the diffused layers, respectively; and (e) forming a conductive film over the trapping film including the edges thereof to form an electrode.

With the first method for fabricating a semiconductor device, when the electrode (word line) of a conductive film is formed over the trapping film, the insulating film hinders the edges of the trapping film from coming into direct contact with the electrode. Therefore, even if ion implantation damages the upper surfaces of the edges of the trapping film to reduce those upper surfaces in thickness, a silicon nitride film which is a substantial charge accumulation layer of the trapping film does not come into direct contact with the electrode. This prevents degradation in the data retention capability of the memory cell. As a result of this, the reliability of the semiconductor device can be improved. Moreover, in the step (d) of forming insulating oxide films in upper portions of the diffused layers, the insulating film is subjected to reoxidation (baking). Therefore, unlike the case where the insulating film is deposited after enhanced oxidation, fixed charges in the insulating film can be diffused, so that threshold voltage failure of the memory cell can be prevented. This enables provision of a threshold voltage substantially equal to that obtained by the conventional method. Furthermore, this reoxidation improves the film quality of the insulating film, so that the electrical breakdown voltage of the trapping film is improved.

Preferably, in the step (c) of the first method for fabricating a semiconductor device, the insulating film is formed to cover an upper surface of the trapping film including the edges thereof and upper surfaces of the diffused layers formed in the semiconductor region. With this method, the insulating film can be formed more easily than the case where the film is selectively formed on the edges of the trapping film.

Preferably, in the first method for fabricating a semiconductor device, the insulating film is made of silicon oxide.

Preferably, in the first method for fabricating a semiconductor device, the thickness of the insulating film is from 5 nm to 50 nm both inclusive.

A second method for fabricating a semiconductor device according to the present invention is characterized by including the step of: (a) forming, on a semiconductor region of a first conductivity type, a trapping film for storing information by accumulating charges; (b) forming a cap film on the trapping film; (c) forming a plurality of openings through the cap film to the trapping film and implanting impurity ions of a second conductivity type into the semiconductor region through the formed openings, thereby forming a plurality of diffused layers of the second conductivity type in portions of the semiconductor region located below the openings, respectively; (d) forming an insulating film to cover the cap film and the diffused layers and etching back the formed insulating film to form a plurality of sidewalls from the insulating film, the sidewalls covering edges of the cap film and the trapping film located toward the openings; (e) removing the cap film after the step (d); (f) subjecting, after the step (e), the semiconductor region to a thermal process in an atmosphere containing oxygen to oxidize upper portions of the diffused layers, thereby forming insulating oxide films in the upper portions of the diffused layers, respectively; and (g) forming a conductive film on the trapping film including the edges thereof to form an electrode.

With the second method for fabricating a semiconductor device, when the electrode of a conductive film is formed on the trapping film, the sidewalls hinder the edges of the trapping film from coming into direct contact with the electrode. Moreover, since the upper surface of the trapping film is covered with the cap film, the upper surface never suffers damages during ion implantation. Therefore, thickness reduction of both ends of the trapping film is prevented. This eliminates direct contact of the electrode with a silicon nitride film which is a substantial charge accumulation layer of the trapping film, so that degradation in the data retention capability of the memory cell can be prevented. Also, the electrical breakdown voltage of the trapping film can be improved.

Preferably, in the second method for fabricating a semiconductor device, the cap film has a different composition from an upper portion of the trapping film. With this method, the cap film and the trapping film have different etching rates in the step (e) of removing the cap film, only the cap film can be removed certainly.

Preferably, in the second method for fabricating a semiconductor device, the cap film is a single-layer film made of any one of silicon nitride, polycrystalline silicon, and amorphous silicon, or a stacked film made of two or more of them.

In the above case, preferably, the thickness of the cap film is from 10 nm to 100 nm both inclusive.

A third method for fabricating a semiconductor device according to the present invention is characterized by including the step of: (a) forming, on a semiconductor region of a first conductivity type, a trapping film for storing information by accumulating charges; (b) forming a plurality of openings in the trapping film and implanting impurity ions of a second conductivity type into the semiconductor region through the formed openings, thereby forming a plurality of diffused layers of the second conductivity type in portions of the semiconductor region located below the openings, respectively; (c) forming protection films of silicon oxide on edges of the trapping film located toward the openings by a pyrogenic oxidation method of an internal combustion system in which water vapor is produced by hydrogen and oxygen introduced onto the semiconductor region; (d) subjecting the semiconductor region to a thermal process in an atmosphere containing oxygen to oxidize upper portions of the diffused layers, thereby forming insulating oxide films in the upper portions of the diffused layers, respectively; and (e) forming a conductive film on the trapping film including the edges thereof to form an electrode.

With the third method for fabricating a semiconductor device, since a pyrogenic oxidation method of an internal combustion system is used, a silicon oxide film thicker than the film made by a typical thermal oxidation can be formed easily on the silicon nitride film. Thus, when the electrode of a conductive film is formed on the trapping film, the protection film formed by the pyrogenic oxidation hinders the edges of the trapping film from coming into direct contact with the electrode. Therefore, even if ion implantation damages the upper surfaces of the both ends of the trapping film to reduce those upper surfaces in thickness, a silicon nitride film which is a substantial charge accumulation layer of the trapping film does not come into direct contact with the electrode. This prevents degradation in the data retention capability of the memory cell.

Preferably, in the third method for fabricating a semiconductor device, the temperature for growth of the protection film in the step (c) is from 700° C. to 1200° C. both inclusive.

Preferably, in the first to third methods for fabricating a semiconductor device, the trapping film is an insulating film containing nitrogen.

Preferably, in the first method for fabricating a semiconductor device, the trapping film is a stacked film of silicon oxide and silicon nitride.

Preferably, in the first to third methods for fabricating a semiconductor device, the trapping film is a stacked film made by sequentially stacking silicon oxide, silicon nitride, and silicon oxide.

BRIEF DESCRIPTION OF THE DRAWINGS

FIG. 1H is a sectional view taken along the line Ih-Ih of FIG. 2.

FIG. 3A is an enlarged cross-sectional view of a portion of the device, and FIG. 3B is a graph showing the time dependence of threshold voltage of the device.

FIGS. 8A to 8G show sectional structures of a MONOS nonvolatile semiconductor memory device in the order of process steps of a conventional fabrication method thereof.

FIG. 9A is an enlarged cross-sectional view of a portion of the device, and FIG. 9B is a graph showing the time dependence of threshold voltage of the device.

DETAILED DESCRIPTION OF THE PREFERRED EMBODIMENTS

First Embodiment

A first embodiment of the present invention will be described with reference to the accompanying drawings.

FIGS. 1A to 1H show sectional structures of a semiconductor device in the order of process steps of a method for fabricating the device according to the first embodiment of the present invention.

Figure 1A:
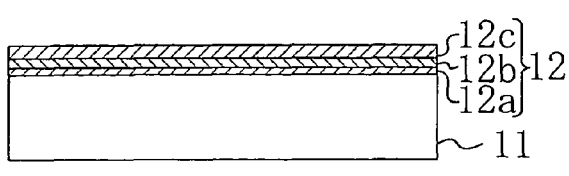
FIGS. 1A to 1H show sectional structures of a semiconductor device in the order of process steps of a method for fabricating the device according to a first embodiment of the present invention.

Referring to FIG. 1A, first, a principal surface of a semiconductor substrate 11 made of p-type silicon (Si) is thermally oxidized in an oxidizing atmosphere at, for example, about 1000° C., thereby forming, on the principal surface of the semiconductor substrate 11, a first silicon dioxide ($SiO_2$) film 12a with a thickness of about 5 nm. Then, for example, by a low pressure chemical vapor deposition (LP-CVD) method with a deposition temperature of about 700° C., a silicon nitride (SiN) film 12b with a thickness of about 15 nm is deposited on the first silicon dioxide film 12a. The deposited silicon nitride film 12b is thermally oxidized in an oxidizing atmosphere at about 1000° C. to form, on the silicon nitride film 12b, a second silicon dioxide film 12c with a thickness of about 10 nm. Thereby, on the principal surface of the semiconductor substrate 11, an ONO film (trapping film) 12 is provided which is formed of the first silicon dioxide film 12a, the silicon nitride film 12b, and the second silicon dioxide film 12c. In the first embodiment, the overlying second silicon dioxide film 12c does not necessarily have to be formed, and, as an alternative to the ONO film 12, an ON film of two-layer structure may be used which is formed of, for example, the silicon dioxide film 12a with a thickness of about 5 nm and the silicon nitride film 12b with a thickness of about 10 nm. Instead of the silicon nitride film 12b for accumulating charges, a charge accumulation film (insulating film) made of silicon oxynitride (SiON), alumina ($Al_2O_3$), or the like may also be used.

Figure 1B:
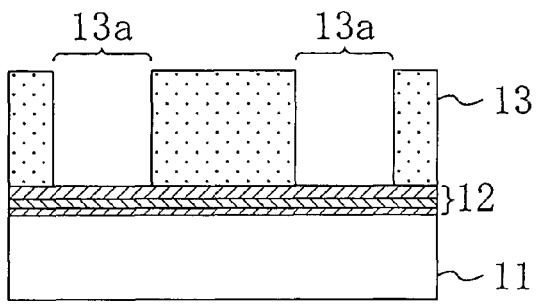

Next, as shown in FIG. 1B, by photolithography, a photoresist pattern 13 for defining a plurality of bit line formation regions 13a is formed on the ONO film 12.

Figure 1C:
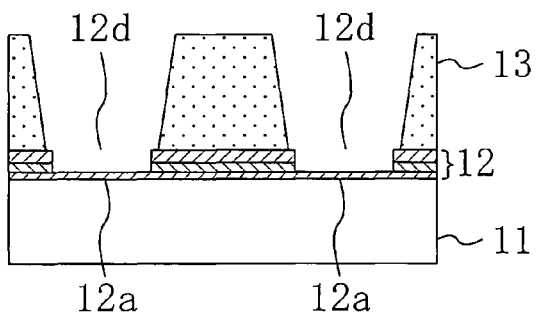

Subsequently, as shown in FIG. 1C, dry etching with an etching gas mainly composed of fluorocarbon is performed using the formed photoresist pattern 13 as a mask, thereby removing portions of the ONO film 12 contained in the bit line formation regions 13a. Thus, openings 12d are formed in the ONO film 12. Note that in this structure, the first silicon dioxide film 12a of the ONO film 12 having a thickness of about 3 nm is left as a protection film of the semiconductor substrate 11 in a subsequent ion implantation step.

Figure 1D:
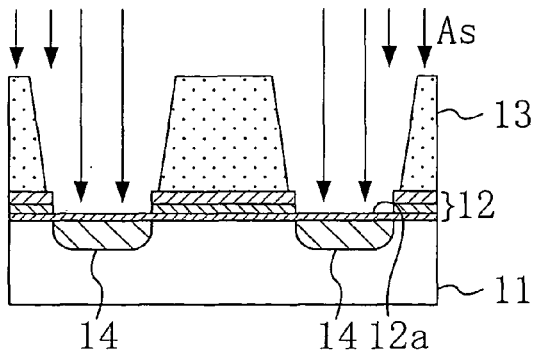

As shown in FIG. 1D, using the photoresist pattern 13 as a mask, arsenic (As) ions serving as an n-type impurity are implanted into the semiconductor substrate 11 on an implantation condition of, for example, an implantation energy of about 50 keV and a dose of about $3 \times 10^{15}$ cm$^{-2}$. Thereby, a plurality of n-type diffused layers 14 serving as bit lines are formed in upper portions of the semiconductor substrate 11.

Figure 1E:
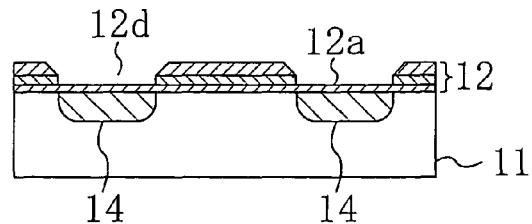

Next, as shown in FIG. 1E, the photoresist pattern 13 is removed by ashing in an oxidizing atmosphere and subsequent cleaning with a mixed solution of aqueous ammonia (NH$_4$OH) and hydrogen peroxide solution (H$_2$O$_2$).

Figure 1F:
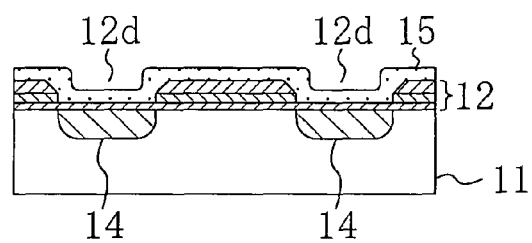

As shown in FIG. 1F, for example, by a CVD method with a monosilane (SiH$_4$) gas at a deposition temperature of about 800° C., a protection oxide film 15 of silicon dioxide having a thickness of about 10 nm is deposited on the entire ONO film 12 on the semiconductor substrate 11 including the openings 12d. If the ONO film 12 is formed to have a two-layer structure of the first silicon dioxide film 12a and the silicon nitride film, the thickness of the protection oxide film 15 is set at about 15 nm.

Figure 1G:
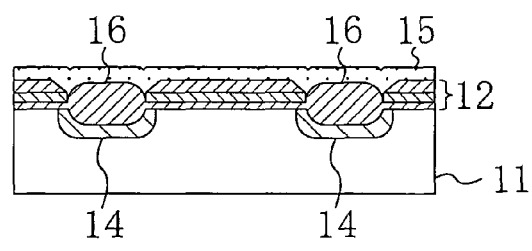

Subsequently, as shown in FIG. 1G, the semiconductor substrate 11 is thermally oxidized through the protection oxide film 15 in an oxidizing atmosphere at, for example, about 900° C. Thereby, the n-type diffused layers 14 are subjected to enhanced oxidation to form, below the protection oxide film 15 and in upper portions of the respective n-type diffused layers 14, bit line oxide films (insulating oxide films) 16 having a thickness of, for example, about 50 nm. Simultaneously with this enhanced oxidation, arsenic ions implanted into the n-type diffused layers 14 are activated in order to serve as a donor.

Figure 1H:
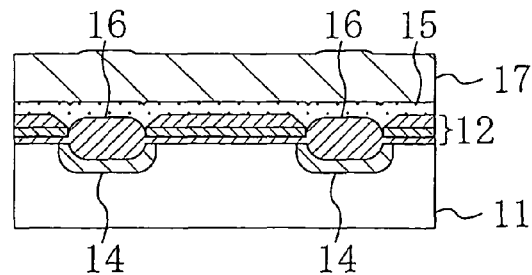
Figure 2:
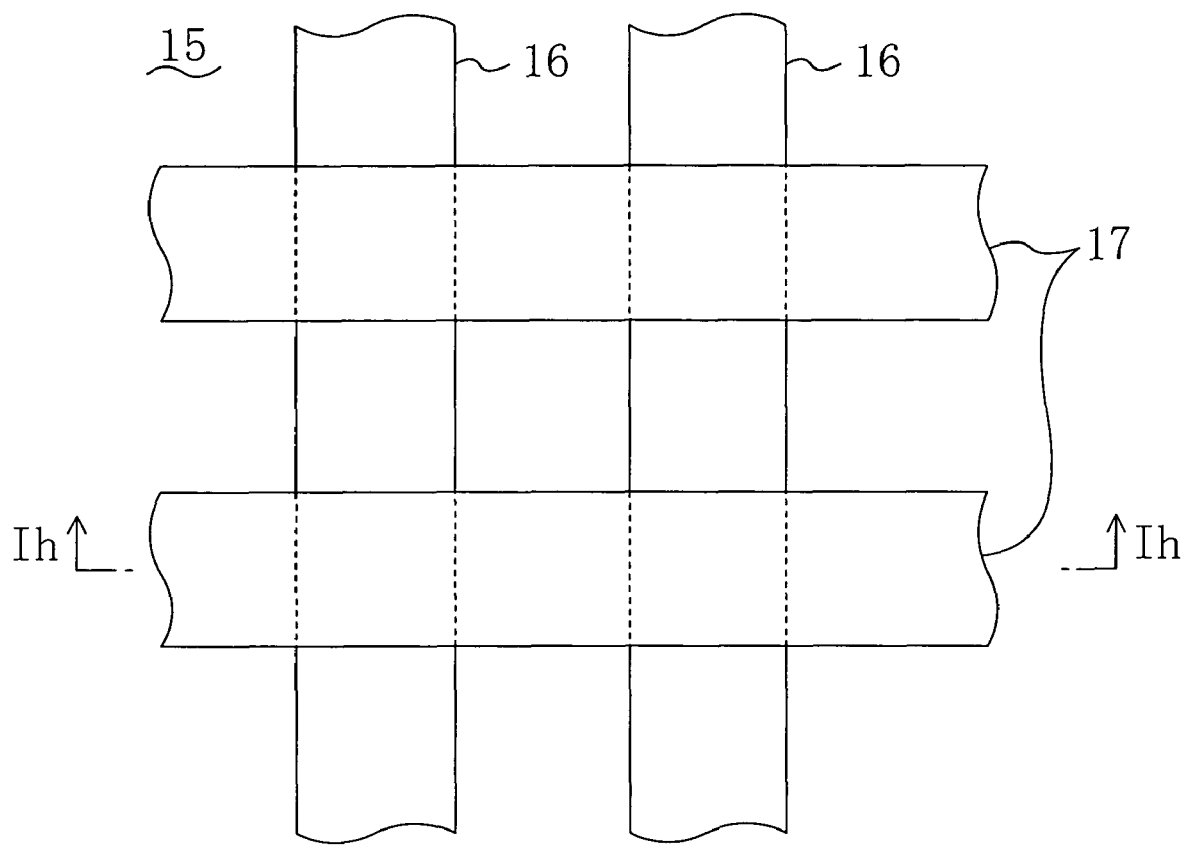
FIG. 2 is a plan view showing a portion of the semiconductor device according to the first embodiment of the present invention.

Next, as shown in FIG. 1H, for example, by a CVD method, a conductive film of polycrystalline silicon is deposited on the protection oxide film 15. Then, as shown in a plan view of FIG. 2, the deposited conductive film is patterned by photolithography and dry etching to form word lines (gate electrodes) 17 from the conductive film.

As described above, in the first embodiment, the edges of the ONO film (trapping film) 12 located toward the openings 12d are covered with the protection insulating film 15 with a sufficient thickness. Therefore, the protection insulating film 15 hinders the edges of the ONO film 12 located toward the openings 12d, particularly the edges of the silicon nitride film 12b from coming into direct contact with the word lines 17, so that degradation in the data retention capability of the semiconductor device can be prevented.

As mentioned previously, in the etching step of the ONO film 12 shown in FIG. 1C and the ion implantation step shown in FIG. 1D, the photoresist pattern 13 is shrunk and thus implanted arsenic ions penetrate and damage the ends of the ONO film 12 located toward the openings 12d. Then, in the cleaning step of the removal of the photoresist pattern 13, of the damaged portions of the ONO film 12, ends of the second silicon dioxide film 12c constituting the ONO film 12 are locally reduced in thickness as shown in FIG. 1E. As a result of this, portions of the silicon nitride film 12b underlying the thickness-reduced portions of the second silicon dioxide film 12c are exposed.

Figure 3A:
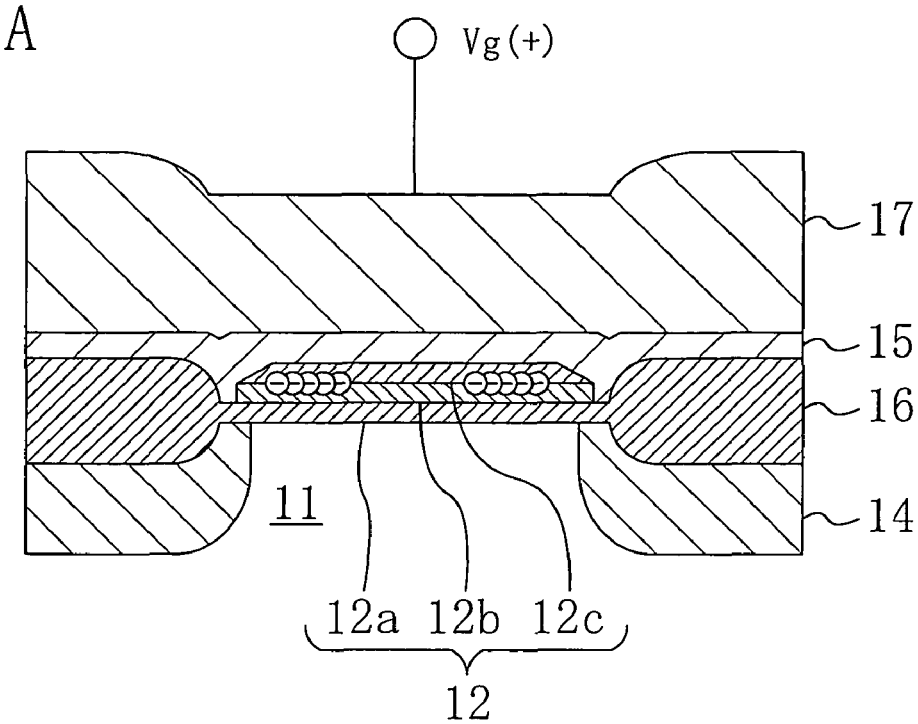
FIGS. 3A and 3B show the semiconductor device according to the first embodiment of the present invention.
Figure 3B:
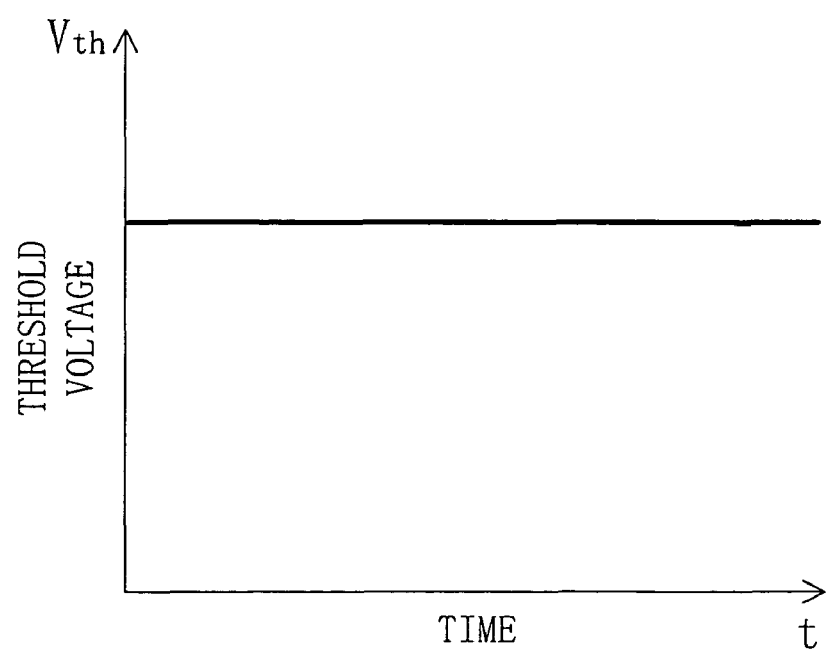

However, in the first embodiment, with the step shown in FIG. 1F, the protection insulating film 15 of silicon dioxide is deposited over the entire semiconductor substrate 11 including the ONO film 12 and the openings 12d. Thus, as shown in an enlarged cross-sectional view of FIG. 3A, in the deposition of the protection insulating film 15, the protection insulating film 15 is formed on exposed portions of the silicon nitride film 12b of the ONO film 12 to make up for thickness reduction of the second silicon dioxide film 12c. Therefore, as shown in FIG. 3B, fluctuation of threshold voltage of the memory cell is avoided. Consequently, this results in dramatic improvement of the data retention capability of the semiconductor device. Furthermore, this results in improvement of the electrical breakdown voltage of the ONO film 12 to provide a highly reliable semiconductor device.

Moreover, as shown in FIG. 1G, when the surfaces of the n-type diffused layers 14 are subjected to enhanced oxidation, reoxidation (baking) of the protection insulating film 15 proceeds simultaneously. Therefore, the film quality of the resulting protection insulating film 15 is improved more than the case where the surfaces of the n-type diffused layers 14 are subjected to enhanced oxidation and then the protection insulating film 15 is deposited. This improves the electrical breakdown voltage of the ONO film 12 and also reduces variation in the thickness of the protection insulating film 15 caused by undergoing multiple steps. Furthermore, reoxidation during the enhanced oxidation diffuses fixed charges in the protection insulating film 15, so that threshold voltage failure of the memory cell can be prevented.

Moreover, in the enhanced oxidation step of the n-type diffused layers 14 shown in FIG. 1G, the edges of the ONO film 12 located toward the openings 12d and the surfaces of the n-type diffused layers 14 are continuously covered with the protection insulating film 15. Therefore, an oxidizing agent (oxygen) is difficult to supply at the boundary between the first silicon dioxide film 12a of the ONO film 12 and the surface of the semiconductor substrate 11, and the protection insulating film 15 makes the ONO film 12 physically adhere onto the surface of the semiconductor substrate 11. This suppresses the dimensions of bird's beaks produced between the ONO film 12 and the semiconductor substrate 11. As a result, the space between the adjacent n-type diffused layers 14 can be decreased, which facilitates miniaturization of the semiconductor device.

In the first embodiment, the protection insulating film 15 is formed on the entire ONO film 12 including the openings 12d. However, it is sufficient that the protection insulating film 15 is formed to cover at least edges of the ONO film 12 located toward the openings 12d.

Second Embodiment

A second embodiment of the present invention will be described below based on the accompanying drawings.

FIGS. 4A to 4K show sectional structures of a semiconductor device in the order of process steps of a method for fabricating the device according to the second embodiment of the present invention.

Figure 4A:
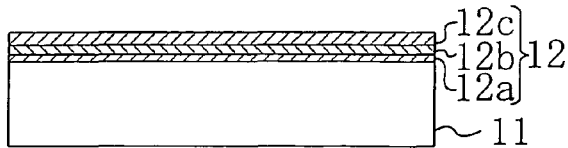
FIGS. 4A to 4K show sectional structures of a semiconductor device in the order of process steps of a method for fabricating the device according to a second embodiment of the present invention.

Referring to FIG. 4A, first, a principal surface of a semiconductor substrate 11 made of p-type silicon is thermally oxidized in an oxidizing atmosphere at a temperature of, for example, about 1000° C., thereby forming, on the principal surface of the semiconductor substrate 11, a first silicon dioxide film 12a with a thickness of about 5 nm. Then, for example, by a low-pressure CVD method with a deposition temperature of about 700° C., a silicon nitride (SiN) film 12b with a thickness of about 20 nm is deposited on the first silicon dioxide film 12a. The deposited silicon nitride film 12b is thermally oxidized in an oxidizing atmosphere at about 1000° C. to form, on the silicon nitride film 12b, a second silicon dioxide film 12c with a thickness of about 15 nm. Thereby, on the principal surface of the semiconductor substrate 11, an ONO film (trapping film) 12 is provided which is formed of the first silicon dioxide film 12a, the silicon nitride film 12b, and the second silicon dioxide film 12c. Note that instead of the silicon nitride film 12b for accumulating charges, a charge accumulation film (insulating film) made of silicon oxynitride, alumina, or the like may also be used.

Figure 4B:
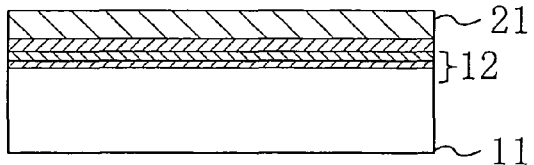

Then, as shown in FIG. 4B, a sacrificial film having a different composition from the second silicon dioxide film 12c is deposited on the ONO film 12. In the second embodiment, for example, a cap film 21 of silicon nitride having a thickness of about 50 nm is deposited by a low-pressure CVD method at about 700° C. As the material of the cap film 21, polycrystalline silicon, amorphous silicon, or the like can be used instead of silicon nitride.

Figure 4C:
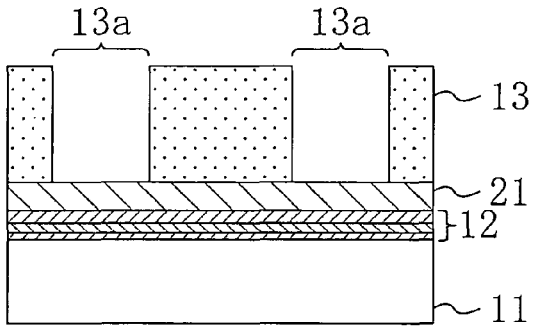

Next, as shown in FIG. 4C, by photolithography, a photoresist pattern 13 for defining a plurality of bit line formation regions 13a is formed on the ONO film 12.

Figure 4D:
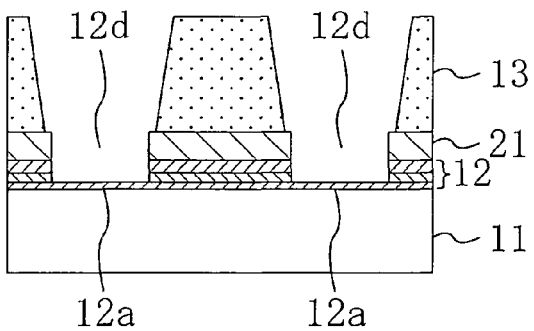

Subsequently, as shown in FIG. 4D, dry etching with an etching gas mainly composed of fluorocarbon is performed using the formed photoresist pattern 13 as a mask, thereby removing portions of the cap film 21 and the ONO film 12 contained in the bit line formation regions 13a. Thus, openings 12d are formed through the cap film 21 to the ONO film 12. Note that in this structure, the first silicon dioxide film 12a of the ONO film 12 having a thickness of about 3 nm is left as a protection film of the semiconductor substrate 11 in a subsequent ion implantation step.

Figure 4E:
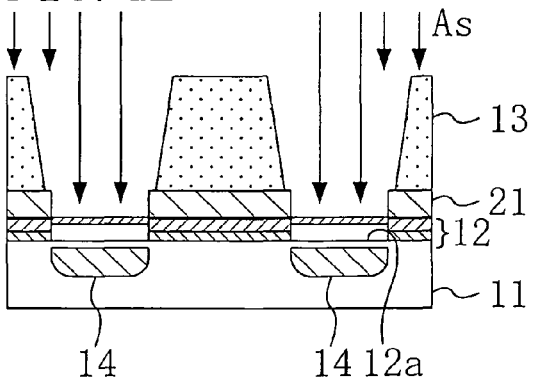

As shown in FIG. 4E, using the photoresist pattern 13 as a mask, arsenic (As) ions serving as an n-type impurity are implanted into the semiconductor substrate 11 on an implantation condition of, for example, an implantation energy of about 50 keV and a dose of about $3 \times 10^{15}$ cm$^{-2}$. Thereby, a plurality of n-type diffused layers 14 serving as bit lines are formed in upper portions of the semiconductor substrate 11.

Figure 4F:
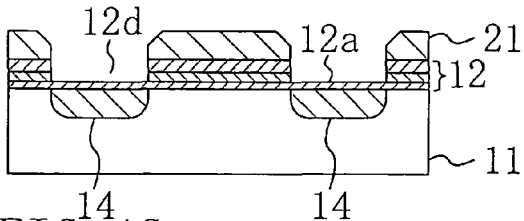

Next, as shown in FIG. 4F, the photoresist pattern 13 is removed by ashing in an oxidizing atmosphere and subsequent cleaning with a mixed solution of aqueous ammonia and hydrogen peroxide solution.

Figure 4G:
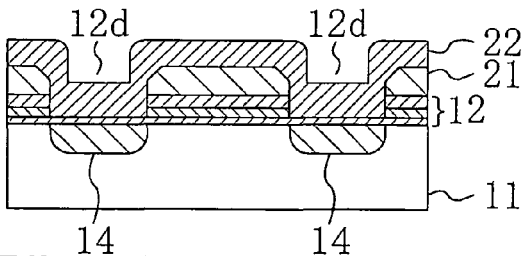

As shown in FIG. 4G, for example, by a CVD method with a monosilane gas at a deposition temperature of about 800° C., a protection insulating film 22 of silicon dioxide having a thickness of about 50 nm is deposited on the entire cap film 21 including the openings 12d over the semiconductor substrate 11.

Figure 4H:
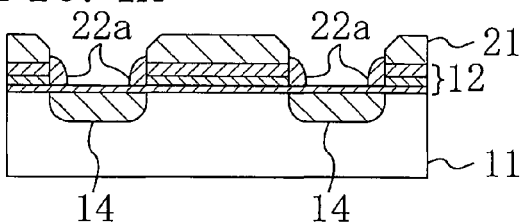

Next, as shown in FIG. 4H, the deposited protection insulating film 22 is subjected to an anisotropic etch back with an etching gas mainly composed of fluorocarbon. Thereby, sidewalls 22a made of the protection insulating film 22 are formed on side surfaces of the cap film 21 and the ONO film 21 located toward the openings 12d.

Figure 4I:
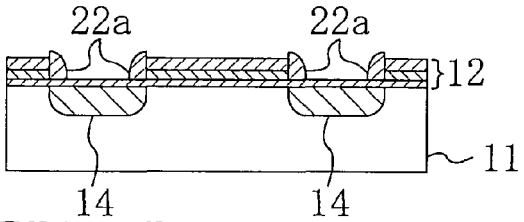

Then, as shown in FIG. 4I, the cap film 21 of silicon nitride is removed by, for example, wet etching with hot phosphoric acid. During this wet etching, the second silicon dioxide film 12c constituting the upper layer in the ONO film 12 is etched with hot phosphoric acid at a lower etching rate than that of silicon nitride, so that the cap film 21 has a good etching selectivity to the ONO film 12 and the sidewall 22a. Therefore, the cap film 21 can be removed selectively to the ONO film 12 and the sidewall 22a.

Figure 4J:
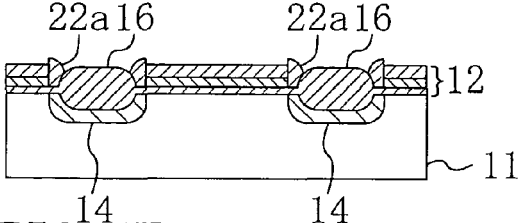

Subsequently, as shown in FIG. 4J, the semiconductor substrate 11 is thermally oxidized in an oxidizing atmosphere at, for example, about 900° C. Thereby, the n-type diffused layers 14 are subjected to enhanced oxidation to form, in upper portions of the respective n-type diffused layers 14, bit line oxide films (insulating oxide films) 16 having a thickness of, for example, about 50 nm. Simultaneously with this enhanced oxidation, arsenic ions implanted into the n-type diffused layers 14 are activated in order to serve as a donor.

Figure 4K:
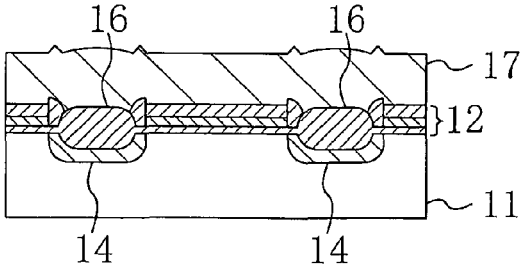

Next, as shown in FIG. 4K, for example, by a CVD method, a conductive film of polycrystalline silicon is deposited on the ONO film 12 and the bit line oxide films 16. Then, the deposited conductive film is patterned by photolithography and dry etching to form word lines (gate electrodes) 17 from the conductive film.

Figure 5:
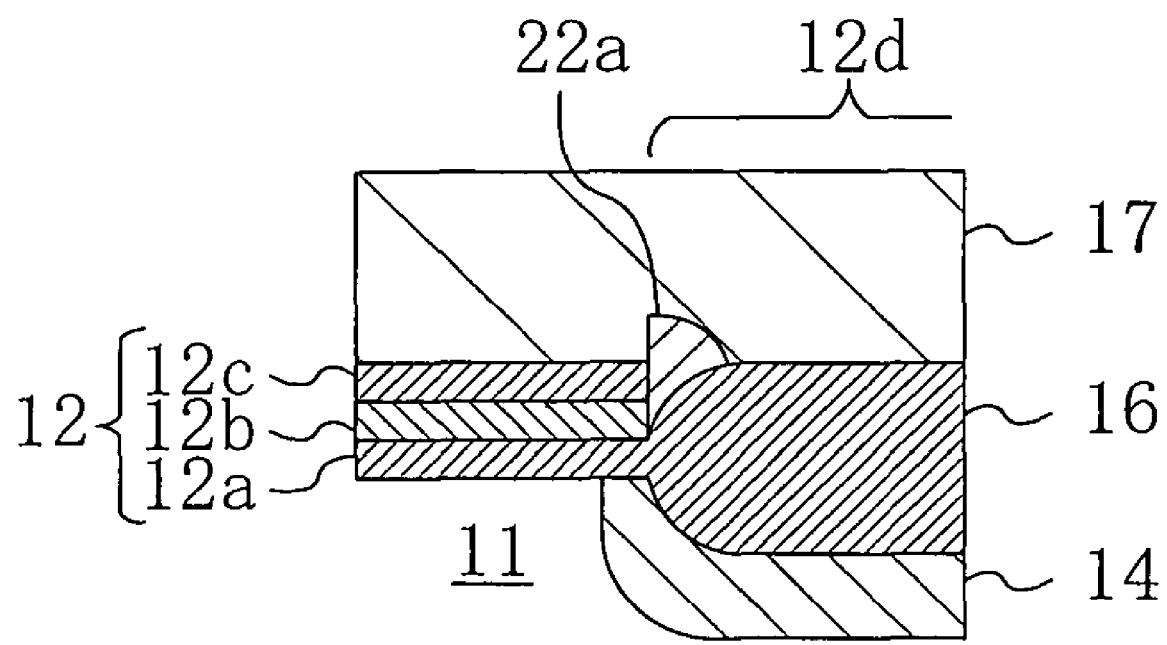
FIG. 5 is a sectional view showing the structure of a portion of the semiconductor device according to the second embodiment of the present invention.

An enlarged cross-sectional view of an edge of the ONO film 12 located toward the opening 12d is illustrated in FIG. 5.

As described above, in the second embodiment, the side edges of the ONO film (trapping film) 12 located toward the openings 12d are covered with the sidewalls 22a made of the protection insulating film with a sufficient thickness. Therefore, the sidewalls 22a hinder the edges of the ONO film 12 located toward the openings 12d, particularly the edges of the silicon nitride film 12b from coming into direct contact with the word lines 17. This results in prevention of degradation in the data retention capability of the semiconductor device and improvement of the electrical breakdown voltage of the ONO film 12.

Also in the second embodiment, in the etching step of the cap film 21 and the ONO film 12 shown in FIG. 4D and the ion implantation step shown in FIG. 4E, shrink of the photoresist pattern 13 occurs. However, in the second embodiment, since the cap film 21 serving as a sacrificial film is formed on the ONO film 12, the edges of the ONO film 12 located toward the openings 12d do not suffer any damages caused by penetration of implanted arsenic ions. Therefore, also in the cleaning step in the removal of the photoresist pattern 13 shown in FIG. 4F, the removal step of the cap film 21 shown in FIG. 4I, and the cleaning step with a chemical solution before the enhanced oxidation shown in FIG. 4J, the ONO film 12 does not suffer any damages due to ion implantation. This prevents local thickness reduction of the ends of the ONO film 12 located toward the openings 12d.

Moreover, in the enhanced oxidation step of the n-type diffused layers 14 shown in FIG. 4J, the edges of the ONO film 12 located toward the openings 12d are covered with the sidewalls 22a made of the protection insulating film. Therefore, an oxidizing agent (oxygen) is difficult to supply at the boundary between the first silicon dioxide film 12a of the ONO film 12 and the surface of the semiconductor substrate 11, which suppresses the dimensions of bird's beaks produced between the ONO film 12 and the semiconductor substrate 11. As a result, the space between the adjacent n-type diffused layers 14 can be decreased, which facilitates miniaturization of the semiconductor device.

In the second embodiment, since the sidewalls 22a made of the protection insulating film 22 are locally formed only on the edges of the ONO film 12 located toward the openings 12d, control of threshold voltage of the memory cell is facilitated.

Third Embodiment

A third embodiment of the present invention will be described below based on the accompanying drawings.

FIGS. 6A to 6H shows sectional structures of a semiconductor device in the order of process steps of a method for fabricating the device according to the third embodiment of the present invention.

Figure 6A:
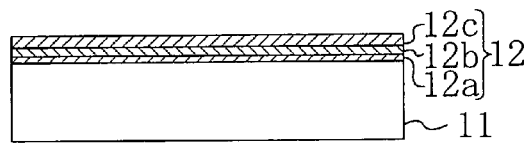
FIGS. 6A to 6H show sectional structures of a semiconductor device in the order of process steps of a method for fabricating the device according to a third embodiment of the present invention.

Referring to FIG. 6A, first, a principal surface of a semiconductor substrate 11 made of p-type silicon is thermally oxidized in an oxidizing atmosphere at, for example, about 1000° C., thereby forming, on the principal surface of the semiconductor substrate 11, a first silicon dioxide film 12a with a thickness of about 5 nm. Then, for example, by a low-pressure CVD method with a deposition temperature of about 700° C., a silicon nitride (SiN) film 12b with a thickness of about 20 nm is deposited on the first silicon dioxide film 12a. The deposited silicon nitride film 12b is thermally oxidized in an oxidizing atmosphere at about 1000° C. to form, on the silicon nitride film 12b, a second silicon dioxide film 12c with a thickness of about 13 nm. Thereby, on the principal surface of the semiconductor substrate 11, an ONO film (trapping film) 12 is provided which is formed of the first silicon dioxide film 12a, the silicon nitride film 12b, and the second silicon dioxide film 12c. In the third embodiment, the second silicon dioxide film 12c does not necessarily have to be formed, and, as an alternative to the ONO film 12, an ON film of two-layer structure may be used which is formed of, for example, the silicon dioxide film 12a with a thickness of about 5 nm and the silicon nitride film 12b with a thickness of about 20 nm. Instead of the silicon nitride film 12b for accumulating charges, a charge accumulation film (insulating film) made of silicon oxynitride, alumina, or the like may also be used.

Figure 6B:
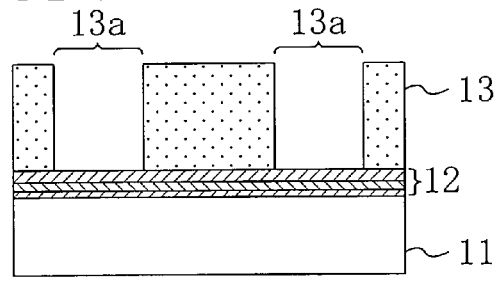

Next, as shown in FIG. 6B, by photolithography, a photoresist pattern 13 for defining a plurality of bit line formation regions 13a is formed on the ONO film 12.

Figure 6C:
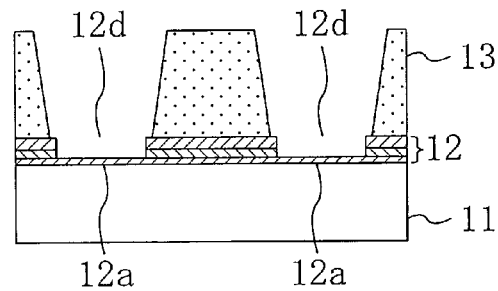

Subsequently, as shown in FIG. 6C, dry etching with an etching gas mainly composed of fluorocarbon is performed using the formed photoresist pattern 13 as a mask, thereby removing portions of the ONO film 12 contained in the bit line formation regions 13a. Thus, openings 12d are formed in the ONO film 12. Note that in this structure, the first silicon dioxide film 12a of the ONO film 12 having a thickness of about 3 nm is left as a protection film of the semiconductor substrate 11 in a subsequent ion implantation step.

Figure 6D:
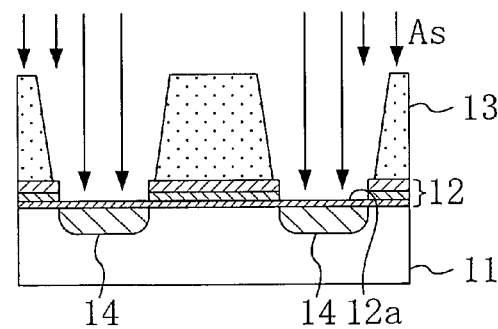

As shown in FIG. 6D, using the photoresist pattern 13 as a mask, arsenic (As) ions serving as an n-type impurity are implanted into the semiconductor substrate 11 on an implantation condition of, for example, an implantation energy of about 50 keV and a dose of about $3 \times 10^{15}$ cm$^{-2}$. Thereby, a plurality of n-type diffused layers 14 serving as bit lines are formed in upper portions of the semiconductor substrate 11.

Figure 6E:
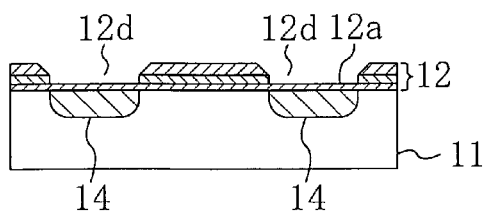

Next, as shown in FIG. 6E, the photoresist pattern 13 is removed by ashing in an oxidizing atmosphere and subsequent cleaning with a mixed solution of aqueous ammonia and hydrogen peroxide solution.

Figure 6F:
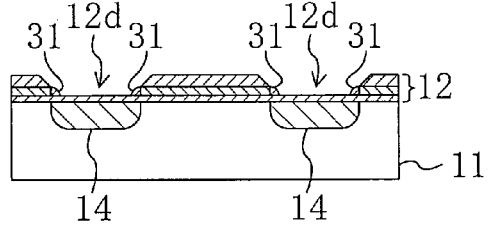

As shown in FIG. 6F, on the respective edges of the ONO film 12 located toward the openings 12d, protection insulating films 31 of silicon dioxide with a thickness of about 10 nm are formed by a so-called pyrogenic oxidation method of an internal combustion system in which, for example, hydrogen (H$_2$) and oxygen (O$_2$) are introduced into a chamber at about 1050° C. and within the chamber, water vapor is produced by the introduced hydrogen and oxygen. By the pyrogenic oxidation method of an internal combustion system, oxygen atoms are substituted for nitrogen atoms of silicon nitride, so that silicon dioxide is formed on exposed portions of the silicon nitride film rather than on the silicon dioxide film. Therefore, in this formation, on the exposed portions of the silicon nitride film 12b of the ONO film 12, the silicon dioxide films are formed to make up for thickness reduction portion of the ONO film 12. Note that the heating temperature during the pyrogenic oxidation is preferably from 700 to 1200° C. inclusive.

Figure 6G:
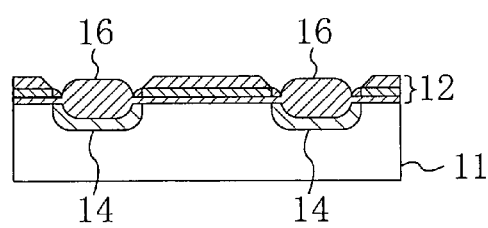

Subsequently, as shown in FIG. 6G, the semiconductor substrate 11 is thermally oxidized in an oxidizing atmosphere at, for example, about 900° C. Thereby, the n-type diffused layers 14 are subjected to enhanced oxidation to form, in upper portions of the respective n-type diffused layers 14, bit line oxide films (insulating oxide films) 16 having a thickness of, for example, about 50 nm. Simultaneously with this enhanced oxidation, arsenic ions implanted into the n-type diffused layers 14 are activated in order to serve as a donor. Note that either the pyrogenic oxidation step shown in FIG. 6F or the enhanced oxidation step shown in FIG. 6G may be conducted first.

Figure 6H:
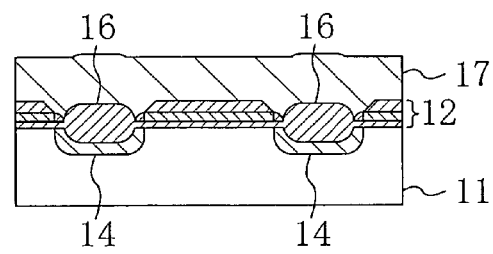

Next, as shown in FIG. 6H, for example, by a CVD method, a conductive film of polycrystalline silicon is deposited on the ONO film 12 and the bit line oxide films 16. Then, the deposited conductive film is patterned by photolithography and dry etching to form word lines (gate electrodes) 17 from the conductive film.

Figure 7:
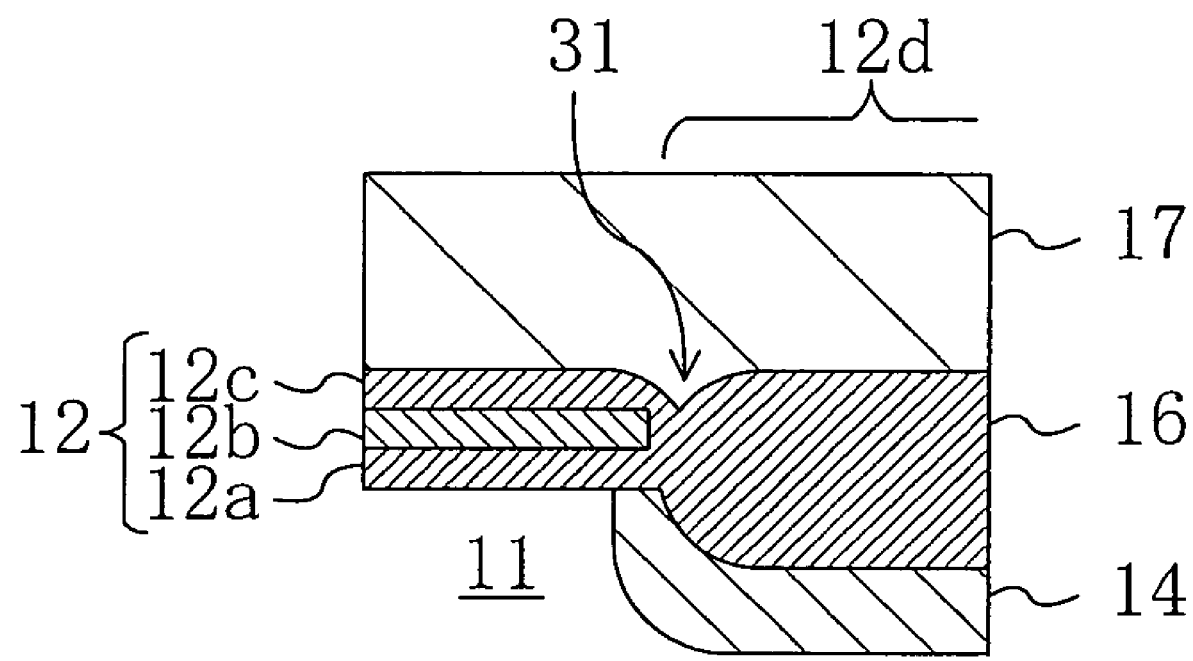
FIG. 7 is a sectional view showing the structure of a portion of the semiconductor device according to the third embodiment of the present invention.
Figure 9A:
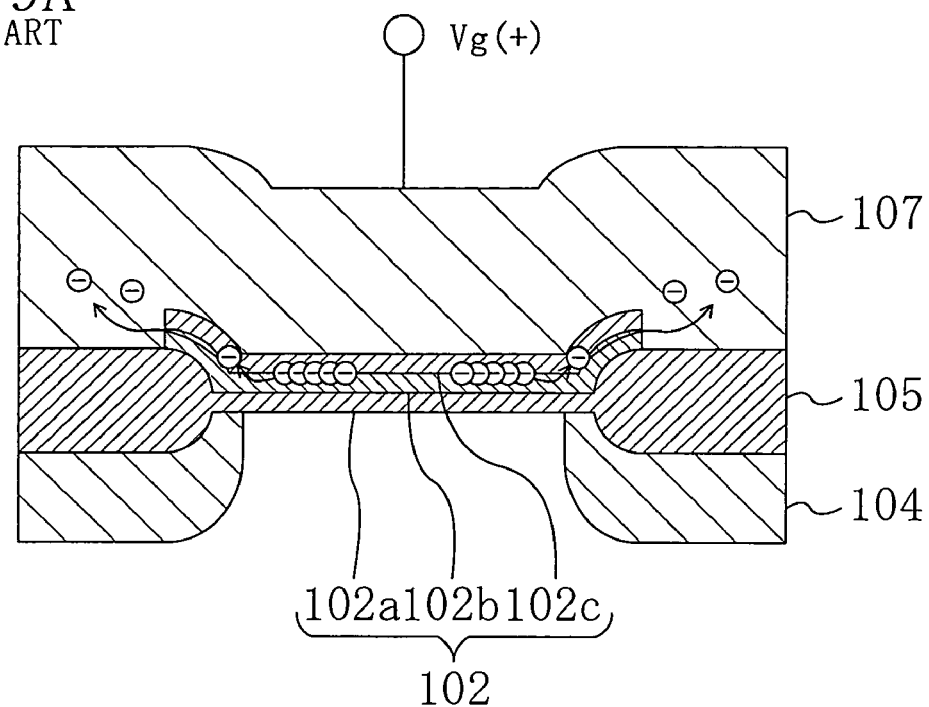
FIGS. 9A and 9B show the conventional MONOS nonvolatile semiconductor memory device.
Figure 9B:
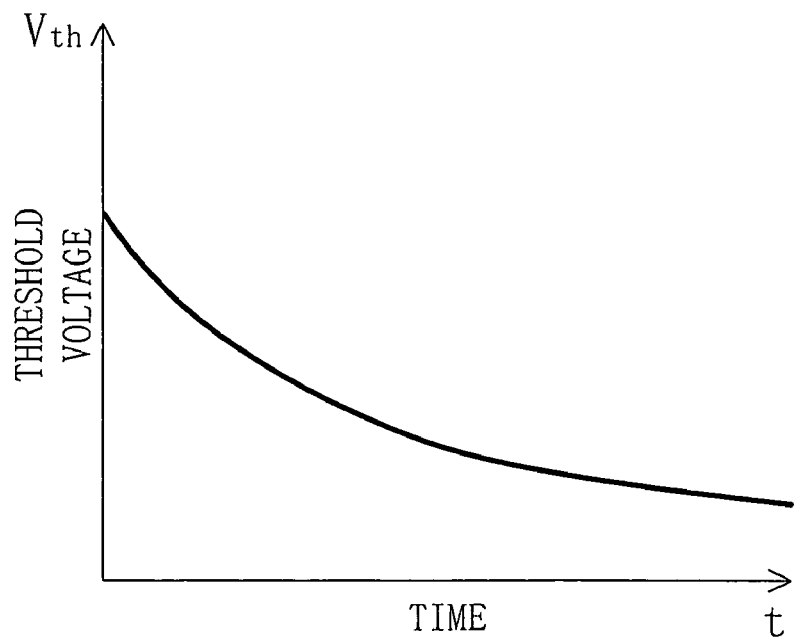
Figure 10A:
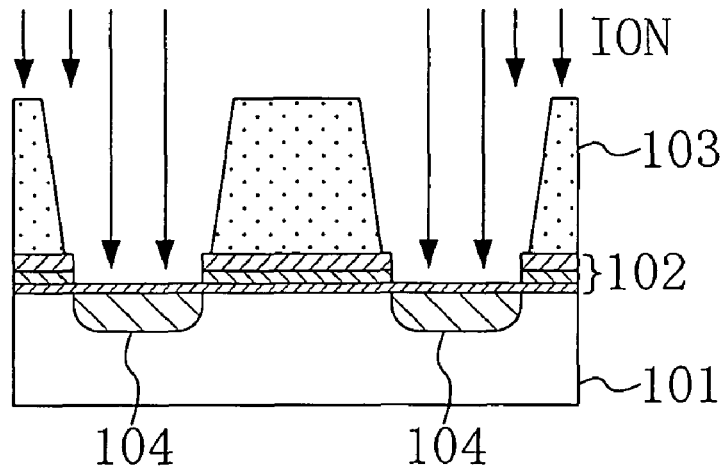
FIGS. 10A to 10C show sectional structures of the MONOS nonvolatile semiconductor memory device in the order of process steps of the conventional fabrication method thereof, in which problems of the conventional method are illustrated.
Figure 10B:
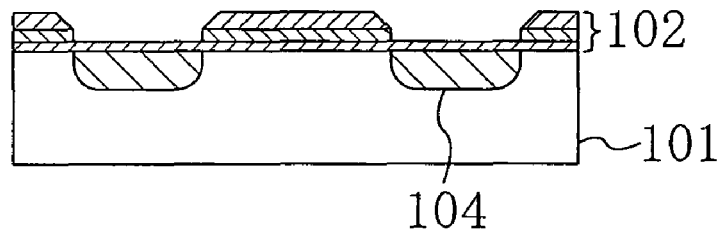
Figure 10C:
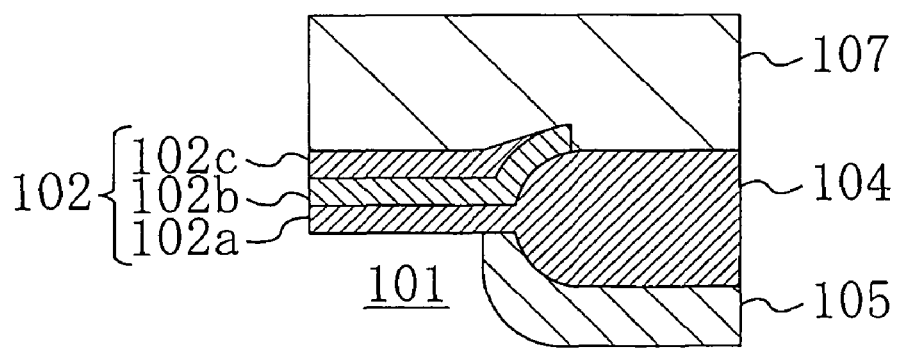

An enlarged cross-sectional view of an edge of the ONO film 12 located toward the opening 12d is illustrated in FIG. 7. As shown in FIG. 7, since the first and second silicon dioxide films 12a and 12c of the ONO film 12, the protection insulating film 31, and the bit line oxide film 16 are all made of silicon dioxide, they are formed integrally.

As described above, in the third embodiment, the side edges of the ONO film (trapping film) 12 located toward the openings 12d are covered with the protection insulating film 31 with a sufficient thickness. Therefore, the protection insulating film hinders the edges of the ONO film 12 located toward the openings 12d, particularly the edges of the silicon nitride film 12b from coming into direct contact with the word lines 17. This results in prevention of degradation in the data retention capability of the semiconductor device and improvement of the electrical breakdown voltage of the ONO film 12.

Also in the third embodiment, in the etching step of the ONO film 12 shown in FIG. 6C and the ion implantation step shown in FIG. 6D, the photoresist pattern 13 is shrunk and thus implanted arsenic ions penetrate and damage the ends of the ONO film 12 located toward the openings 12d. Then, in the cleaning step of the removal of the photoresist pattern 13, of the damaged portions of the ONO film 12, ends of the second silicon dioxide film 12c constituting the ONO film 12 are locally reduced in thickness as shown in FIG. 6E. As a result of this, portions of the silicon nitride film 12b underlying the thickness-reduced portions of the second silicon dioxide film 12c are exposed.

However, in the third embodiment, in the subsequent step shown in FIG. 6F, by a pyrogenic oxidation method of an internal combustion system, the protection insulating films 31 of silicon dioxide are formed on the edges of the ONO film 12 located toward the openings 12d. Thus, as shown in an enlarged cross-sectional view of FIG. 7, on exposed portions of the silicon nitride film 12b of the ONO film 12, the protection insulating films 31 are formed to make up for thickness reduction of the second silicon dioxide film 12c. This results in dramatic improvement of the data retention capability of the semiconductor device. Furthermore, this results in improvement of the electrical breakdown voltage of the ONO film 12 to provide a highly reliable semiconductor device.

In the third embodiment, since only the edges of the ONO film 12 located toward the openings 12d are selectively oxidized to increase the thickness thereof, the memory cell can have almost the same threshold voltage as the conventional technique.

As described above, the method for fabricating a semiconductor device according to the present invention has an advantage that degradation in the data retention capability of the memory cell is prevented to provide a highly reliable semiconductor device. Therefore, the present invention is useful particularly for semiconductor devices and the like including a trapping film and a bit line and provided in a MONOS nonvolatile semiconductor memory device.

What is claimed is:

1. A method for fabricating a semiconductor device, comprising the steps of:
   (a) forming, on a semiconductor region of a first conductivity type, a trapping film including a silicon nitride layer serving as a charge accumulation layer for storing information by accumulating charges;
   (b) forming a plurality of openings in the trapping film and implanting impurity ions of a second conductivity type into the semiconductor region through the formed openings, thereby forming a plurality of diffused layers of the second conductivity type in portions of the semiconductor region located below the openings, respectively;
   (c) directly thermally oxidizing exposed edges of the silicon nitride layer serving as the charge accumulation layer included in the trapping film located toward the openings to selectively form protection films of silicon oxide by a thermal oxidation method using a pyrogenic oxidation method of an internal combustion system in which water vapor is produced by hydrogen and oxygen introduced onto the semiconductor region;
   (d) subjecting the semiconductor region to a thermal process in an atmosphere containing oxygen to oxidize upper portions of the diffused layers, thereby forming insulating oxide films in the upper portions of the diffused layers, respectively; and
   (e) forming a conductive film on the trapping film including the edges thereof to form an electrode,
   wherein the protection film formed in the step (c) hinders the charge accumulation layer from coming into direct contact with the electrode in the step (e).

2. The method of claim 1,
wherein the temperature for growth of the protection film in the step (c) is from 700° C. to 1200° C. both inclusive.

3. The method of claim 1,
wherein the trapping film is an insulating film containing nitrogen.

4. The method of claim 1,
wherein the trapping film is a stacked film made by sequentially stacking silicon oxide, silicon nitride, and silicon oxide.

5. The method of claim 1,
wherein the trapping film is a stacked film of silicon oxide and silicon nitride.

6. The method of claim 1,
wherein the step of selectively forming protection films includes a step of selectively forming protection films of silicon oxide only on edges of the silicon nitride layer serving as the charge accumulation layer included in the trapping layer.

* * * * *